United States Patent [19]

Ishizaki

[11] Patent Number: 4,489,283

[45] Date of Patent: Dec. 18, 1984

[54] POWER AMPLIFIER

[75] Inventor: Yasuhiro Ishizaki, Kohriyama, Japan

[73] Assignee: Mitsubishi Denki Kabushiki Kaisha, Tokyo, Japan

[21] Appl. No.: 343,769

[22] Filed: Jan. 28, 1982

[30] Foreign Application Priority Data

Feb. 13, 1981 [JP] Japan .................................. 56-19700

[51] Int. Cl.³ .............................................. H03F 3/30
[52] U.S. Cl. .................................... 330/268; 330/264; 330/266
[58] Field of Search ............... 330/265, 267, 268, 270, 330/273, 274, 266

[56] References Cited

U.S. PATENT DOCUMENTS 4,215,318  7/1980  Kawanabe ........................... 330/268
4,356,452 10/1982  Iwamatsu ............................ 330/265

FOREIGN PATENT DOCUMENTS 663073  5/1979  U.S.S.R. ............................. 330/265

Primary Examiner—James B. Mullins
Attorney, Agent, or Firm—Oblon, Fisher, Spivak, McClelland & Maier

[57] ABSTRACT

A power amplifier comprises a power amplifying element for driving a load wherein a forward bias voltage applied between an input terminal and an output terminal of said power amplifying element which varies depending upon an output current of said power amplifying element, is detected and converted into a calibration current to feed back the current to the input terminal of said power amplifying element to calibrate variation of the forward bias voltage of said power amplifying element in linear variation in full cycle of input signal given by a signal source and to prevent cut-off of said power amplifying element in full cycle.

18 Claims, 6 Drawing Figures

POWER AMPLIFIER

BACKGROUND OF THE INVENTION

1. Field of the Invention

The present invention relates to a power amplifier having an idling current circuit which is capable of continuously feeding an idling current to an output power amplifying element in all cycles.

2. Description of the Prior Art

The circuit shown in FIG. 1 has been known. In FIG. 1, the reference numeral (1) designates a signal source resistance Rs; (2) designates an emitter resistor $R_2$ which is common for an N-CH driver transistor (10) and a P-CH driver transistor (11); (3), (4), (5) and (6) respectively resistors which form a current variable constant current source; (7) designates an emitter resistor $R_7$ of an N-CH power transistor (12); (8) designates an emitter resistor $R_8$ of a P-CH power transistor (13); (9) designates a load resistor $R_L$; (10) designates an N-CH driver transistor $Q_1$; (11) designates a P-CH driver transistor $Q_2$; (12) designates an N-CH power transistor $Q_3$; (13) designates a P-CH power transistor $Q_4$; (14) designates a transistor for positive output current detection; (15) designates a transistor $Q_6$ for negative output current detection; (16) designates a transistor $Q_7$ as a positive variable constant current source; (17) designates a transistor $Q_8$ as a negative variable constant current source; (18) and (19) respectively designate a diode for calibrating a temperature of the variable constant current source; (20) designates a voltage source for idling; (21), (22) respectively designate voltage sources for comparation; (23) and (24) respectively designate integrating capacitors; (25) designates a positive power source; (26) designates a negative power source; and (27) designates a signal source.

The operation of the circuit shown in FIG. 1 will be illustrated.

During no signal, the sum of an idling current $I_D$ fed from a fixed bias power source (20) and an idling current $I_V$ of a variable bias circuit set by detected voltages ($E_2$-$V_{R7}$), ($E_3$-$V_{R8}$) which are given by the equation:

$$E_1 = (V_{BE1} + V_{BE3} + R_7 I_D) + (V_{BE2} + V_{BE4} + R_8 I_D) \quad (1)$$

is fed to the power transistors (12), (13).

The positive half cycle in the N-CH side will be illustrated. A signal fed from the signal source (27) is fed through the signal source resistor (1) to the N-CH driver transistor (10) to drive the N-CH power transistor (12) whereby the output current $I_O$ corresponding to each signal source form is fed from the positive power source (25) through the N-CH power transistor (12) to the negative resistor (9). At this moment, the base-emitter voltage $V_{BE5}$ of the transistor for detection (14) is given by the equation:

$$V_{BE5} = E_2 - R_7(I_D + I_V + I_O) \quad (2)$$

The base-emitter voltage decreases depending upon increase of the output current $I_O$. The transistor for detection (14) works for cut-off whereby the positive variable constant current source comprising the resistors (3), (5), the transistor (16), the diode (18) and the capacitor (23) does not feed an output current to the base of the N-CH power transistor (12) and the common emitter resistor (2) for the driver transistors (10), (11) as the load.

In the next negative half cycle, the output current $I_O$ is fed from the P-CH power transistor (13) through the emitter resistor (8) to the load resistor (9) to give the equations:

$$V_{BE1} + V_{BE3} + V_{R7} \approx E_1 - (V_{BE2} + V_{BE4} + R_8 I_0) \leq 0 (I_0 >> I_D I_V) \quad (3)$$

$$V_{BE1} = E_1 - (V_{BE2} + R_2 I_2) > 0 \quad (4)$$

Therefore, the N-CH driver transistor (10) does not cut-off whereas the N-CH power transistor (12) works for cut-off. At the moment, $V_{R7} \leq 0$ is given. The base-emitter voltage $V_{BE5}$ of the transistor for detection (14) is given as $V_{BE5} = (E_0 - 0) > 0$. The transistor for detection (15) works for turn-on to drive the transistor (16) as the positive variable constant current source through the integrated circuit. Therefore, the transistor (16) feed the current to the common emitter resistor (2) and the base of the N-CH power transistor (12) and the N-CH power transistor (12) does not work for cut-off in the negative half cycle. When excess of the idling current $I_V$ is fed to the N-CH power transistor (12) by the driving of the transistor (16) as the variable constant current source, the base-emitter voltage $V_{BE5} = E_2 - R_7 I_V$ is lowered to reduce the idling current $I_V$ whereby the normal idling current $I_V$ set by the reference voltage $E_2$ and the base-emitter voltage $V_{BE5}$ of the transistor for detection (5) and the emitter resistor (7) of the N-CH power transistor (12). The operation of the N-CH side in full cycle has been illustrated and the operation of the P-CH side is the same.

The conventional power amplifier has the aforementioned structure. Thus, it is possible to conduct the output power amplifying element in full cycle. However, the voltage variation in the half cycle for cut-off is not high enough to detect it in the case of small values of the emitter resistors (7), (8) of the power transistors. Thus it is necessary to increase the values of the emitter resistors (7), (8). The power efficiency is disadvantageously lowered in the case of large values of the emitter resistors (7), (8). In the half cycle for turn-on, excess of the voltage is applied between the emitter resistors (7), (8) whereby the transistor for detection (14) or (15) is cut-off and the variable bias circuit itself results in the switching operation. Even though the switching strain of the power amplifying element is improved, the switching strain of the bias circuit as the side-effect is disadvantageously given.

SUMMARY OF THE INVENTION

It is an object of the present invention to overcome the disadvantage of the conventional power amplifier.

The present invention is to provide a power amplifier which prevents cut-off of a power amplifying element in full cycle in which an output terminal (an emitter of a transistor) of a power amplifying element is a reference point of a reference voltage of an amplifying element for detection and an input terminal of the amplifying element for detection is an input terminal of the power amplifying element (a base of a transistor) whereby the input voltage of the amplifying element for detection is forward bias voltage of the power amplifying elemet ($V_{BE}$ in a transistor) to provide enough variation of the input voltage of the amplifying element for detection in the half cycle for cut-off so as to satisfactorily detect whereas the forward bias voltage of the power amplifying element is not so high in the half cycle for turn-on to prevent cut-off of the amplifying element for detection.

The present invention is also to provide a power amplifier for amplifying signal fed from a signal source by a power amplification with a pair of power amplifying elements by dividing the signal into a positive half cycle and a negative half cycle, which comprises a pair of impedance elements which are connected in series between output terminals of the power amplifying elements; a load connected between the serial connected point of the impedance elements and the earth; a fixed bias device for feeding idling current to the power amplifying elements and said fixed bias device being connected between the signal source and the load; and a variable bias circuit which is connected to the output terminal of the power amplifying element to detect voltage variation resulted by current variation of the power amplifying element and to apply bias voltage corresponding to the voltage variation to the input terminal of the power amplifying element.

The emitter resistor can be impedance element which is constant to audio frequency.

DETAILED DESCRIPTION OF THE PREFERRED EMBODIMENTS

Figure 1:
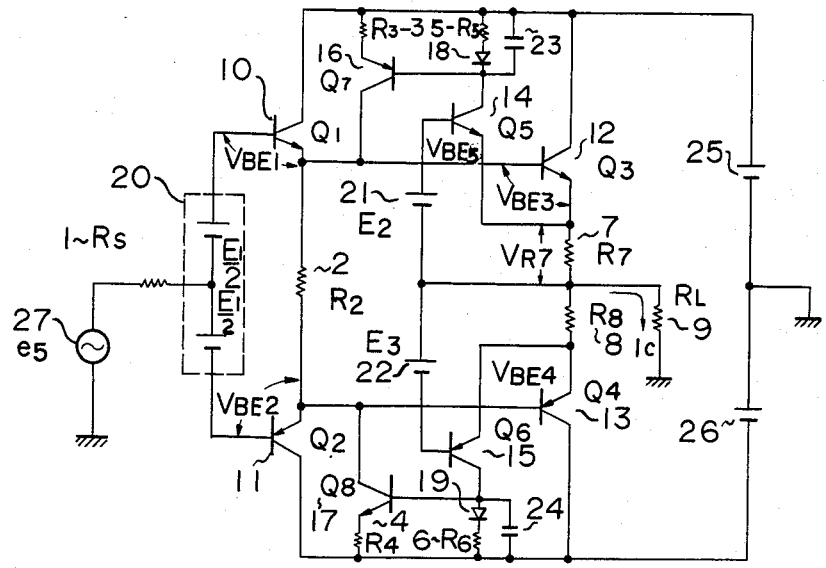
FIG. 1 is a circuit diagram of an output unit of a conventional power amplifier.

Referring to the drawings, one embodiment of the present invention will be illustrated.

Figure 2:
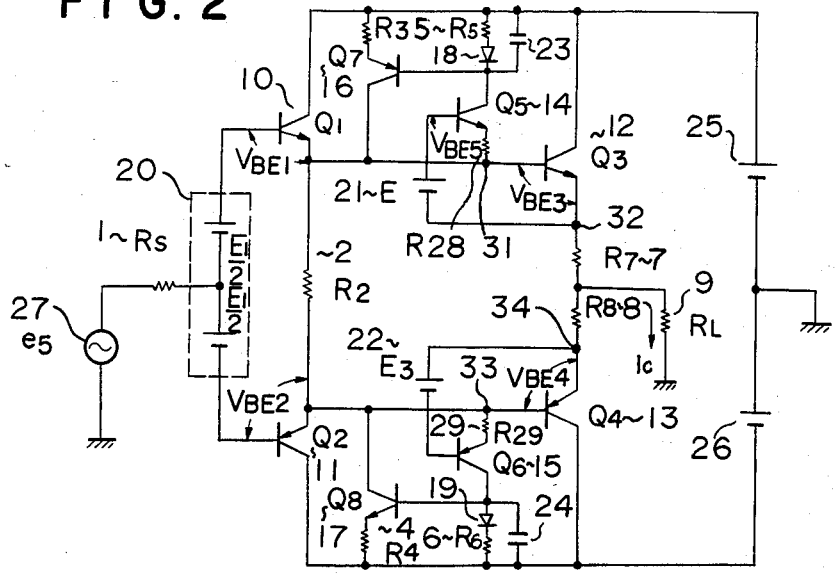
FIG. 2 is a circuit diagram of an output unit of one embodiment of a power amplifier of the present invention.
Figure 3:
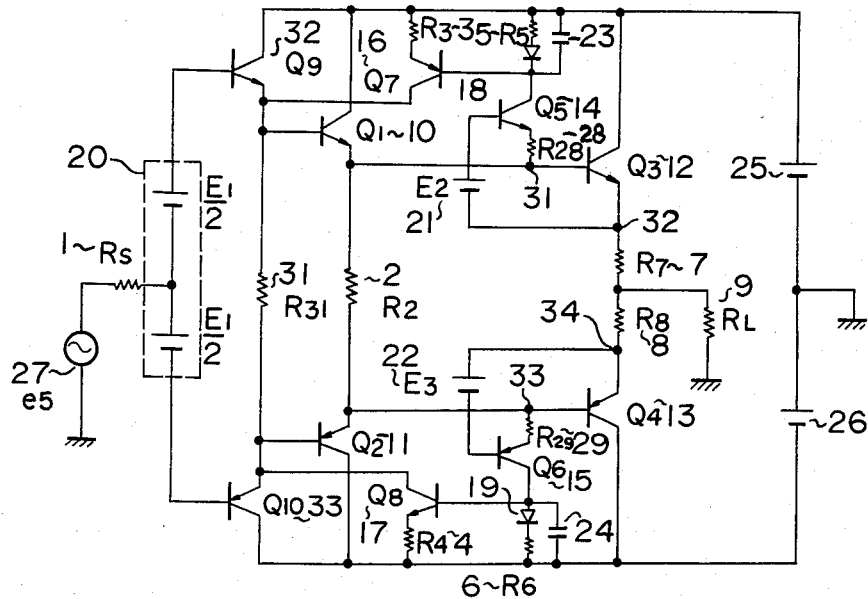
FIG. 3 to 6 are respectively circuit diagrams of output units of the other embodiments of the power amplifier of the present invention.
Figure 4:
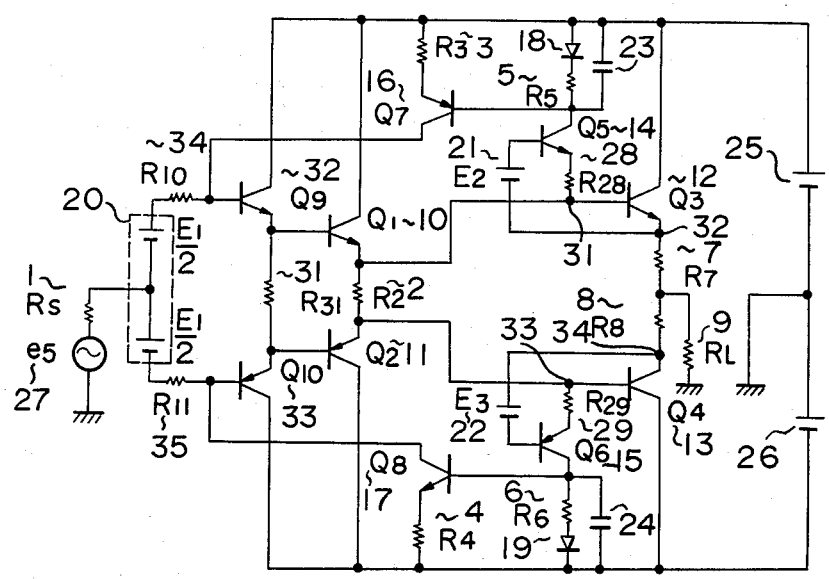

In FIG. 2, the reference (1) designates a signal source resistance $R_S$; (2) designates a common emitter resistor $R_2$ for an N-CH driver transistor (10) and a P-CH driver transistor (11); (3), (4), (5) and (6) respectively designate resistors which form a current variable constant current source; (7) designates an emitter resistor of an N-CH power transistor (12); (8) designates an emitter resistor of a P-CH power transistor (13); (9) designates a load resistor $R_L$; (10) designates an N-CH driver transistor $Q_1$; (11) designates a P-CH driver transistor $Q_2$; (12) designates an N-CH power transistor $Q_3$ and the base thereof is an input terminal (31) and the emitter thereof is an output terminal (32); (13) designates a P-CH power transistor $Q_4$ and the base thereof is an input terminal (33) and the emitter thereof is an output terminal (34); (14) designates a transistor $Q_5$ for detecting positive output current; (15) designates a transistor $Q_6$ for detecting negative output current; (16) designates a transistor $Q_7$ as a positive variable constant current source; (17) designates a transistor $Q_8$ as a negative variable constant current source; (18) and (19) respectively designate diodes for calibrating temperature of the variable constant current source; (20) designates a fixed bias voltage source for idling; (21) and (22) respectively designate power sources for comparison; (23) and (24) respectively designate capacitors for integration (filter capacitors); (25) designates a positive power source; (26) designates a negative power source; (27) designates a signal source; (28) designates a resistor for setting detective sensitivity of the transistor for detection (14); and (29) designates a resistor for setting detective sensitivity of the transistor for detection (15).

The operation of the embodiment shown in FIG. 2 will be illustrated.

During no signal, the sum of an idling current $I_D$ fed from the fixed bias power source (20) and an idling current $I_V$ fed from the variable bias circuit set by detected voltages $V_{BE5}=(E_2-V_{BE3}-V_{R28})$ and $V_{BE6}=(E_3-V_{BE4}-V_{R29})$ which are given by the equation:

$$E_1 \approx (V_{BE1}+V_{BE3}+R_7 I_D)+(V_{BE2}+V_{BE4}+R_8 I_D) \quad (5)$$

is fed to the power transistors (12), (13). In general, the idling current $I_{t0}$ is given by the equation;

$$I_{t0}=I_D+I_V=\gamma \cdot \{(\alpha Ea + \tfrac{1}{2}\beta Eb)/(\alpha \cdot \gamma + (1+2r_a/R_2)\beta)\} \quad (6)$$

wherein $Ea=E_2=E_3$; $Eb=E_1$; $re_0=re_3=re_4$; $ra=re_1=re_2$; $RE+R_7=R_8$; $\alpha=ra/(rb+R)$; $rb=re_5=re_6$; $R=R_{28}=R_{29}$; $\gamma=re_0/(re_0+R_E)$; $\beta=R_x/(R_x+R_y)$; $R_x=R_3=R_4$; and $R_y=R_6$.

The positive half cycle in the N-CH side will be illustrated. The signal is fed from the signal source (27) through the signal source resistance (1) to the N-CH driver transistor (10) to drive the N-CH driver transistor (12). Therefore, the output current $I_0$ corresponding to the signal source type is fed from the positive power source (25) through the N-CH power transistor (127 to the load resistor (9). At the moment, the voltage $B_{BE3}$ of the N-CH power transistor (13) is higher whereby the base-emitter voltage $V_{BE5}$ of the transistor for detection (14) $V_{BE5}=(E_2-V_{BE3}-V_{R28})$ is lowered. Thus, the output current of the transistor for detection 814) is reduced whereby the positive variable constant current source formed by the resitors (3), (5), the transistor (16), the diode (18) and the capacitor (23) does not feed the output current to the base of the N-CH power transistor (12) and the common emitter resistor (2) for the driver transistors (10), (11) as the load. At the moment, the detective sensitivity is controlled by the value $R_{28}$ of the resistor (28) as shown by the equation:

$$V_{BE5}=(E_2-V_{BE3}-V_{R28})$$

In the negative half cycle, the output current $I_0$ is fed from the P-CH power transistor (13) through the emitter resistor (8) to the load resistor (9) to give the equation;

$$V_{BE1}+V_{BE3}+V_{R7} \approx E_1-(V_{BE2}+V_{BE4}+V_{R8}) \leq 0;$$
$$(I_0>>I_D, I_V); V_{R8} \approx R_8(I_0+I_D+I_V)-R_8 I_0. \quad (7)$$

Therefore, it gives the equation:

$$V_{BE1}=E_1-(V_{BE2}+R_2 I_2) \geq 0 \quad (8)$$

The N-CH driver transistor (10) does not work for cut-off whereas the N-CH driver transistor (12) works for cut-off. When the N-CH driver transistor (12) acts for the cut-off, the base-emitter voltage $V_{BE3}$ of the N-CH power transistor (12) approaches the zero whereby the voltage increases from the detective voltage of the transistor for detection (14) $V_{BE5}=(E_2-V_{BE3}-V_{R28})$ to drive the transistor (16) as the positive variable constant current source through the integrated circuit. The transistor (16) increases the current feed to the common emitter resistor (2) and the base of the N-CH power transistor (12) whereby the N-CH power transistor (12) is not cut-off in the negative half cycle. When excess of the variable idling current $I_V$ is fed to the N-CH power transistor (12) by the driving resulted by the variable constant current source (16), the base-emitter voltage $V_{BE3}$ of the N-CH power transistor increases to decrease $V_{BE5}=E_2-(V_{BE3}-V_{R28})$ and the current $I_V$ is reduced. Therefore, the normal variable idling current $I_V$ set by the comparative voltage $E_2$, the base-emitter voltage $V_{BE3}$ of the transistor for detection (14) and the value $R_{28}$ of the resistor (28), is fed.

The operation of the full cycle in the N-CH side has been illustrated. The operation of the full cycle in the P-CH side is the same.

As described, the variable bias circuit controls to perform gradual variation of the base-emitter voltage of the power transistor and the detected voltage is only the base-emitter voltage of the power transistor to be small variation. Thus, the transistor for detection can be operated in A class operation and the switching operation as the side-effect is not caused. In such operation, the idling current can be approximately given by the equation:

$$I_t \simeq [I_{t0}(1-\gamma'/2)-\{-\gamma' I_0/(I_{t0}+I_0)\}$$
$$I_0/[1-\gamma'(I_{0t}+2I_0)/(I_{0t}+I_0)2]$$

$$\gamma'=(\alpha+\beta)/(\gamma+\beta) \qquad (9)$$

The references in the equations are as follows:
$E_1$: voltage of the fixed bias power source (20);
$E_2$: voltage of the comparative voltage (21);
$E_3$: voltage of the comparative voltage (23);
$V_{BE1}$: base-emitter voltage of the N-CH driver transistor (10);
$V_{BE3}$: base-emitter voltage of the N-CH power transistor (12);
$V_{BE2}$: base-emitter voltage of the P-CH driver transistor (11);
$V_{BE4}$: base-emitter voltage of the P-CH power transistor (13);
$V_{R28}$: terminal voltage of the resistor (28);
$V_{R29}$: terminal voltage of the resistor (29);
$re_3$: internal emitter resistance of the N-CH power transistor (12);
$re_4$: internal emitter resistance of the P-CH power transistor (13);
$re_1$: internal emitter resistance of the N-CH driver transistor (10);
$re_2$: internal emitter resistance of the P-CH driver transistor (11);
$R_7$: resistance of the emitter resistor (7);
$R_8$: resistance of the emitter resistor (8);
$re_5$: internal emitter resistance of the transistor for detection (14);
$re_6$: internal emitter resistance of the transistor for detection (15);
$R_5$: resistance of the resistor (5);
$R_6$: resistance of the resistor (6);
$R_3$: resistance of the resistor (3);
$R_4$: resistance of the resistor (4);
$I_0$: output current;
$R_2$: resistance of the common emitter resistor (2);
$I_2$: current passing through the common emitter resistor (2);
$V_{BE5}$: base-emitter voltage of the transistor for detection (14);
$V_{BE6}$: base-emitter voltage of the transitor for detection (15);
$V_{R7}$: terminal voltage of the emitter resistor (7);
$V_{R8}$: terminal voltage of the emitter resistor (8).

Figure 5:
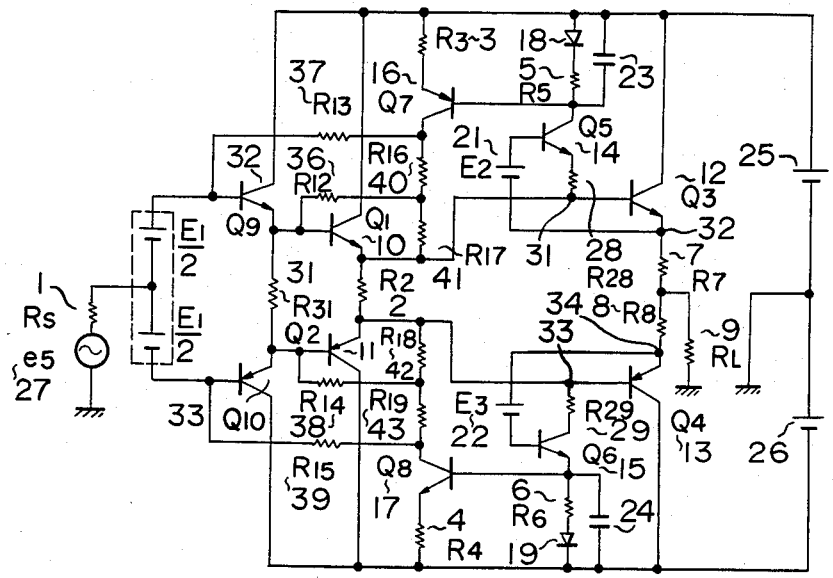
Figure 6:
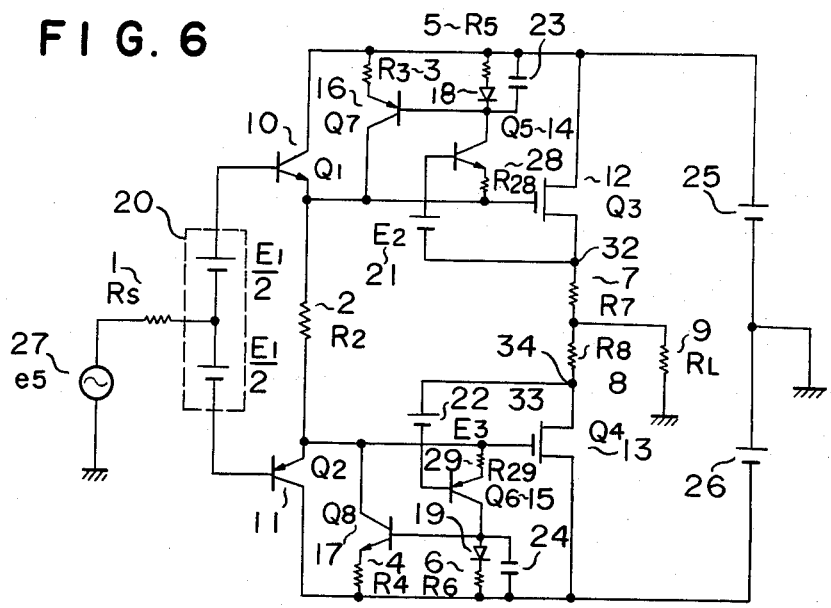

In the aforementioned embodiment, the emitters of the transistors (16) (17) are respectively connected to the bases of the power transistors (12), (13). It is also possible to feed a variable bias current to the driver transistors (10), (11) and the three step driver transistors (32), (33) as well as the power transistors (12), (13) by the terminal voltages of the resistors (40), (41), (42), (43) applied by the output current of the constant current transistors (16), (17) as is shown in FIG. 5. It is also possible to use field effect transistors as the power transistors (12), (13) as shown in FIG. 6.

In a symmetrical Darlington output circuit (diamond form output circuit) or an imparted Darlington output circuit, the same effect is attained by the structure of the embodiments.

In FIGS. 3 to 6, the same reference in FIG. 2 designates the identical or corresponding parts; and the reference (31) designates a common emitter resistor; (32) designate three step N-CH driver transistor $Q$; (33) designates three step P-CH driver transistor $Q_{10}$; (34)–(43) respectively designate resistors.

In accordance with the present invention, only variation of the base-emitter voltage of the power transistor is used as the detected voltage of the variable bias circuit whereby cut-off of the power transistor is prevented and nonlinearity of base-collect voltage of the power transistor to the output current can be improved and the variable bias circuit can be operated in A class operation by reducing the variation of the base-emitter voltage of the power transistor. A power amplifier having high accuracy and low distortion factor.

I claim:

1. A power amplifer for amplifying a signal fed from a signal source by a power amplification, having a pair of power amplifying elements each having an input terminal and an output terminal, which divides said signal into a positive half cycle and a negative half cycle, wherein said power amplifier comprises:
a pair of impedance elements connected in series between said output terminals of said power amplifying elements;
a load connected between the serial connected point of said impedance elements and the earth;
a fixed bias device connected to said signal source and said power amplifying elements for feeding idling current to said power amplifying elements; and
a variable bias circuit connected to said input terminals and said output terminals of each of said power amplifying elements for detecting voltage variation, between said input terminals and said output terminals of said power amplifying elements produced by current variations of said power amplifying element and for applying a bias voltage corresponding to the voltage variation to said input terminal of said power amplifying element.

2. The power amplifier according to claim 1 wherein the pair of said impedance elements are resistors.

3. The power amplifier according to claim 1 wherein a driver circuit for amplifying the signal of said signal source is connected between said signal source and said input terminal of said power amplifying element.

4. The power amplifier according to claim 1 wherein said fixed bias means is constant voltage source connected between said signal source an said input terminal of said power amplifying element.

5. The power amplifier according to claim 1 wherein said variable bais circuit is a constant current source circuit.

6. The power amplifier according to claim 5 wherein said constant current source circuit comprises a temperature calibrating element.

7. The power amplifier according to claim 6 wherein said temperature calibrating element is a temperature calibrating diode.

8. The power amplifier according to claim 1 wherein said variable bias circuit is a circuit for amplifying the detected voltage variation.

9. The power amplifier according claim 1 wherein said variable bias circuit comprises a voltage source for comparison which detects voltage variation result by the output current variation of said power amplifying element.

10. The power amplifier according to claim 1 wherein the pair of said power amplifying elements are semiconductor power amplifying element in P channel and N channel.

11. The power amplifier according to claim 10 wherein said semiconductor power amplifying element is a transistor.

12. The power amplifier according to claim 10 wherein said semiconductor power amplifying elements are plurality of transistors in Darlington connection.

13. The power amplifier according to claim 10 wherein said seimconductor power amplifying element is a field effect type transistor.

14. The power amplifier for amplifying a signal fed from a signal source by a power amplfication, having a pair of power amplifying elements each having an input terminal and an output terminal, which divides said signal into a positive half cycle and a negative half cycle, said power amplifier comprising:
a pair of resistors connected in series between said output terminals of said power amplifying elements;
a load connected between the serial connected point of said resistors and the earth;
a fixed bias device connected to said power amplifying elements and said signal source for feeding idling current to said power amplifying elements;
a variable bias circuit connected to said input terminals and said output terminals of each said of power amplifying elements for detecting voltage variation, between said input terminals and said output terminals of said power amplifying elements produced by current variation of said power amplifying element and to apply bias voltage corresponding to the voltage variation to said input terminal of said power amplifying element;
a constant current circuit for feeding current of a constant current source to said variable bias circuit; and
a driver circuit for amplifying the signal of said signal source which is connected between said signal source and said power amplifying element.

15. The power amplifier according to claim 14 wherein said constant current circuit is a circuit in temperature calibration.

16. The power amplifier according to claim 14 wherein said driver circuit is in Darlington connection.

17. The power amplifier for amplifying a signal fed from a signal source by a power amplification, having a pair of power amplifying elements each having an input terminal and an output terminal which divides said signal into a positive half cycle and a negative half cycle, said power amplifier comprising:
a pair of resistors connected in series between output terminals of said power amplifying elements;
a load connected between the serial connected point of said resistors and the earth;
a fixed bias device connected to said signal source and said power amplifying elements for feeding idling current to said power amplifying elements;
a variable bias circuit connected to said input terminals and output terminals of each of said power amplifying elements for detecting voltage variation between said input terminals and said output terminals of said power amplifying elements, produced by current variations of said amplifying elements and to apply bias voltage corresponding to the voltage variation to the input terminal of said power amplifying element;
a constant current circuit for feeding current of a constant power source to said variable bias circuit; and
a driver circuit connected between said signal source and said input terminals of said power amplifying elements for amplifying the signal of said signal source;
wherein an input terminal of said driver circuit is connected to said transistor of said constant current circuit.

18. A power amplifier for amplifying a signal fed from a signal source by a power amplification, having a pair of power amplifying elements each having an input terminal and an output terminal which divides the signal into a positive half cycle and a negative half cycle, said power amplifier comprising:
a pair of resistors connected in series between output terminals of said power amplifying elements;
a load connected between the serial connected point of said resistors and the earth;
a fixed bias device connected to said signal source and said power amplifying elements for feeding idling current to said power amplifying elements;
a variable bias circuit connected to said input and said and output terminals of each of said power amplifying elements to detect voltage variation between said input terminals and said output terminals of said power amplifying elements, produced by current variation of said amplifying element and to apply bias voltage corresponding to the voltage variation to the input terminal of said power amplifying element;
a constant current circuit having a transistor for feeding current of a constant power source to said variable bias circuit;
and a driver circuit connected between said signal source and the input terminals of said power amplifying elements for amplifying the signal of said signal source;
wherein an output terminal of said driver circuit is connected to said transistor of said constant current circuit.

* * * * *